(12) United States Patent
Wakatsuki et al.

(10) Patent No.: US 12,040,228 B2
(45) Date of Patent: Jul. 16, 2024

(54) SEMICONDUCTOR DEVICE AND MANUFACTURING METHOD THEREOF

(71) Applicant: Kioxia Corporation, Tokyo (JP)

(72) Inventors: Satoshi Wakatsuki, Yokkaichi (JP); Tomohisa Iino, Yokkaichi (JP); Naomi Fukumaki, Yokkaichi (JP); Misuzu Sato, Yokkaichi (JP); Masakatsu Takeuchi, Obu (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/495,417

(22) Filed: Oct. 6, 2021

(65) Prior Publication Data

US 2022/0028739 A1 Jan. 27, 2022

Related U.S. Application Data

(62) Division of application No. 16/814,716, filed on Mar. 10, 2020, now abandoned.

(30) Foreign Application Priority Data

Sep. 13, 2019 (JP) .................................. 2019-167191

(51) Int. Cl.
*H01L 21/768* (2006.01)
(52) U.S. Cl.
CPC .. *H01L 21/76865* (2013.01); *H01L 21/76843* (2013.01)
(58) Field of Classification Search
CPC ......... H01L 21/76865; H01L 21/76843; H01L 23/53261; H01L 21/76876; H01L 21/28562; H01L 21/76877; H01L 27/115
See application file for complete search history.

(56) References Cited

U.S. PATENT DOCUMENTS

| | | |
|---|---|---|
| 6,998,340 B2 | 2/2006 | Tsutae |
| 8,415,674 B2 | 4/2013 | Lim et al. |
| 9,548,228 B2 | 1/2017 | Chandrashekar et al. |
| 9,653,353 B2 | 5/2017 | Chandrashekar et al. |
| 9,754,824 B2 | 9/2017 | Schloss et al. |
| 10,361,213 B2 | 7/2019 | Sharangpani et al. |
| 10,475,809 B2 | 11/2019 | Ito et al. |
| 2004/0115929 A1* | 6/2004 | Lim .................. H01L 21/76843 438/653 |

(Continued)

FOREIGN PATENT DOCUMENTS

| | | | |
|---|---|---|---|
| JP | 8-107144 A | 4/1996 | |
| JP | 3504940 B2 | 3/2004 | |

(Continued)

OTHER PUBLICATIONS

Machine Translation WO 2015/145750 (Year: 2015).*

*Primary Examiner* — Julia Slutsker
(74) *Attorney, Agent, or Firm* — Oblon, McClelland, Maier & Neustadt, L.L.P.

(57) ABSTRACT

A semiconductor device according to an embodiment includes: a barrier metal layer provided on a surface of an insulating layer; and a conductive layer having a first metal layer provided on a surface of the barrier metal layer, and a second metal layer provided on a surface of the first metal layer. The second metal layer includes an identical metal to metal of the first metal layer, and an impurity configured to remove fluorine bonded to the metal.

4 Claims, 4 Drawing Sheets

(56) References Cited

U.S. PATENT DOCUMENTS

| | | | |
|---|---|---|---|
| 2006/0264038 A1* | 11/2006 | Kato | ........................ C23C 16/34 |
| | | | 438/656 |
| 2006/0284231 A1 | 12/2006 | Natsume et al. | |
| 2014/0120723 A1* | 5/2014 | Fu | ............................ C23C 16/14 |
| | | | 438/680 |
| 2016/0351444 A1 | 12/2016 | Schloss et al. | |
| 2017/0011958 A1 | 1/2017 | Ogawa et al. | |
| 2018/0130820 A1 | 5/2018 | Ito et al. | |
| 2020/0203365 A1 | 6/2020 | Weng | |
| 2022/0181158 A1* | 6/2022 | Bowes | .............. C23C 16/45527 |

FOREIGN PATENT DOCUMENTS

| | | | | |
|---|---|---|---|---|
| JP | 2007-5409 A | 1/2007 | | |
| JP | 2014-135311 A | 7/2014 | | |
| JP | 5622491 B2 | 11/2014 | | |
| JP | 2015-512568 A | 4/2015 | | |
| JP | 2017-14615 A | 1/2017 | | |
| JP | 2018-78160 A | 5/2018 | | |
| JP | 6494940 B2 | 4/2019 | | |
| TW | 201421650 A | 6/2014 | | |
| WO | WO2015/145750 | * | 10/2015 | ........... H01L 21/285 |
| WO | WO 2015/145750 A1 | 10/2015 | | |

* cited by examiner

SEMICONDUCTOR DEVICE AND MANUFACTURING METHOD THEREOF

CROSS-REFERENCE TO RELATED APPLICATIONS

This application is a divisional of U.S. application Ser. No. 16/814,716 filed Mar. 10, 2020; U.S. application Ser. No. 16/814,716 is based upon and claims the benefit of priority from Japanese Patent Application No. 2019-167191, filed on Sep. 13, 2019; the entire contents of which are incorporated herein by reference.

FIELD

Embodiments of the present invention relate to a semiconductor device and a manufacturing method thereof.

BACKGROUND

There are formed, in manufacturing of a semiconductor device, lines including contact plugs, via plugs, word lines and the like. For the formation of such lines, film formation technologies are used, such, for example, as CVD (Chemical Vapor Deposition) and ALD (Atomic Layer Deposition). In these film formation technologies, the lines are formed, for example, by alternately introducing material gas including fluorine and metal, such as tungsten hexafluoride ($WF_6$), and reducing gas including hydrogen ($H_2$).

DETAILED DESCRIPTION

Embodiments will now be explained with reference to the accompanying drawings. The present invention is not limited to the embodiments.

A semiconductor device according to an embodiment includes: a barrier metal layer provided on a surface of an insulating layer; and a conductive layer having a first metal layer provided on a surface of the barrier metal layer, and a second metal layer provided on a surface of the first metal layer. The second metal layer includes an identical metal to metal of the first metal layer, and an impurity configured to remove fluorine bonded to the metal.

While in the embodiments mentioned later, the present invention is applied to word lines of three-dimensionally stacked semiconductor memories, it can also be applied to lines other than word lines, such, for example, as contact plugs and via plugs. Moreover, it can also be applied to lines of semiconductor devices other than three-dimensionally stacked semiconductor memories.

First Embodiment

Figure 1:
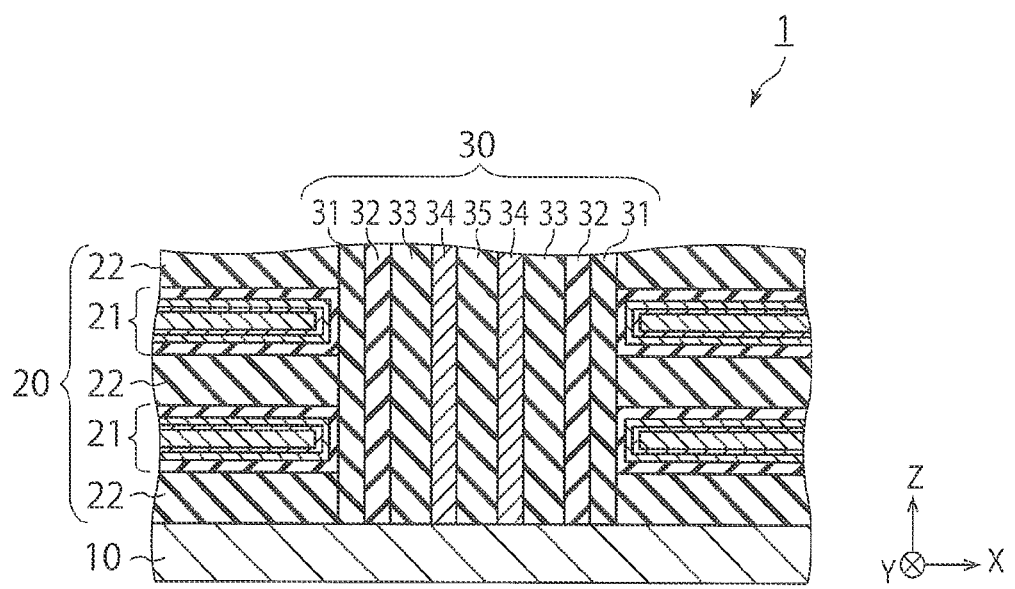
FIG. 1 is a cross sectional view showing a configuration of the essential part of a semiconductor device according to a first embodiment.

FIG. 1 is a cross sectional view showing a configuration of the essential part of a semiconductor device according to a first embodiment. A semiconductor device 1 shown in FIG. 1 includes a semiconductor substrate 10, a stacked body 20 and a memory film 30.

The semiconductor substrate 10 is exemplarily a silicon substrate. The stacked body 20 is provided on the semiconductor substrate.

As shown in FIG. 1, the stacked body 20 has a plurality of electrode layers 21 and a plurality of insulating layers 22. The plurality of electrode layers 21 and the plurality of insulating layers 22 are alternately stacked in a Z-direction perpendicular to the semiconductor substrate 10. The plurality of electrode layers 21 function as word lines of this three-dimensionally stacked semiconductor memory. The plurality of insulating layers 22 exemplarily includes silicon oxide ($SiO_2$), and insulatively separate the individual electrode layers 21.

Figure 2:
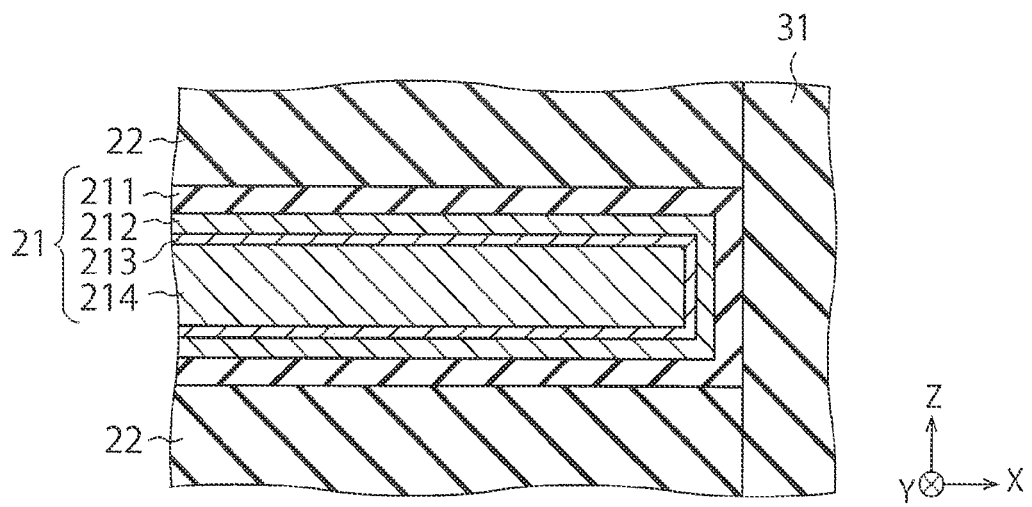
FIG. 2 is a cross sectional view having an electrode layer expanded.

FIG. 2 is a cross sectional view having the electrode layer 21 expanded. As shown in FIG. 2, the electrode layer 21 has a block insulating layer 211 (insulating layer), a barrier metal layer 212, a metal layer 213 (first metal layer) and a metal layer 214 (second metal layer). The metal layer 213 and the metal layer 214 constitute a conductive layer.

The block insulating layer 211 exemplarily includes aluminum oxide ($Al_2O_3$), and is provided on surfaces of the insulating layers 22. The barrier metal layer 212 exemplarily includes titanium nitride (TiN), and is provided on a surface of the block insulating layer 211. A thickness of the barrier metal layer 212 is approximately 3 nm.

The metal layer 213 is provided on a surface of the barrier metal layer 212. The metal layer 213 is an initial nucleation layer for metal, and includes a metal and a nucleation substance for improving a nucleation density of the metal. The metal is exemplarily tungsten (W). The nucleation substance is exemplarily diborane ($B_2H_6$) or monosilane ($SiH_4$). Moreover, a thickness of the metal layer 213 is not more than 5 nm.

The metal layer 214 is provided on a surface of the metal layer 213. The metal layer 214 is a bulk layer including an identical metal to metal of the metal layer 213 and an impurity capable of removing fluorine bonded to the metal contained in the metal layer 214. The metal is exemplarily tungsten (W). The impurity is exemplarily at least one of an aluminum atom (Al), a zirconium atom (Zr), a hafnium atom (Hf), a silicon atom (Si), a boron atom (B), a titanium atom (Ti), an oxygen atom (O), an yttrium atom (Y) and a carbon atom (C). A specific resistance of the metal layer 214 is desirably not more than 40 $\mu\Omega\cdot cm$. Notably, a bond energy between tungsten and each of the aforementioned atoms except the oxygen atom and the carbon atom among the aforementioned exemplary impurities is higher than a bond energy between tungsten and fluorine.

As shown in FIG. 1, the memory film 30 has a block insulating film 31, a charge storage film 32, a tunnel insulating film 33, a channel film 34 and a core insulating film 35. The block insulating film 31 exemplarily includes silicon oxide, and faces the electrode layers 21 and the insulating layers 22. The charge storage film 32 exemplarily includes silicon nitride (SiN), and faces an inner circumferential surface of the block insulating film 31. The tunnel insulating film 33 exemplarily includes silicon oxide nitride (SiON), and faces an inner circumferential surface of the charge storage film 32. The channel film 34 exemplarily includes polysilicon, and faces an inner circumferential surface of the tunnel insulating film 33. The core insulating film 35 exemplarily includes silicon oxide, and faces an inner circumferential surface of the channel film 34. Notably, the structure of the memory film 30 is not limited to the structure shown in FIG. 1.

Hereafter, manufacturing steps of the semiconductor device according to the present embodiment are described. Film formation steps for the electrode layers 21 are herein described.

Figure 3:
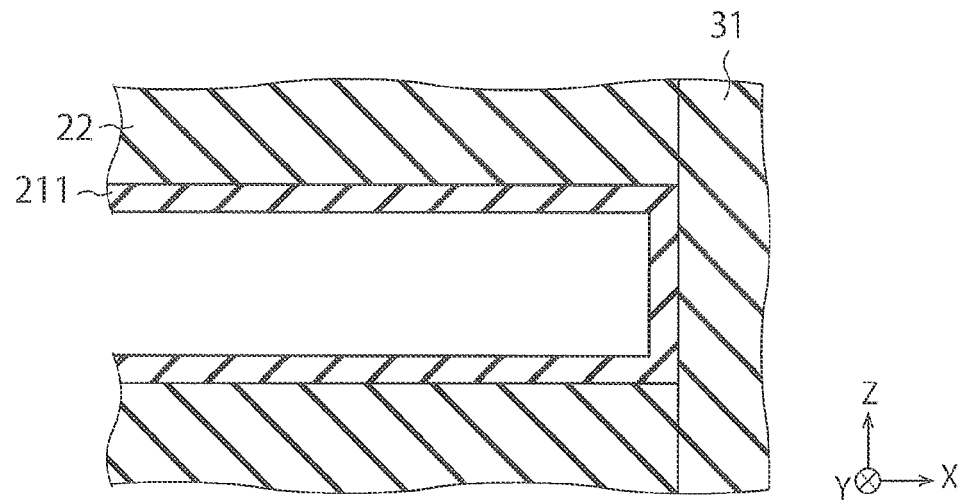
FIG. 3 is a cross sectional view for explaining a step of forming a block insulating layer.
Figure 4:
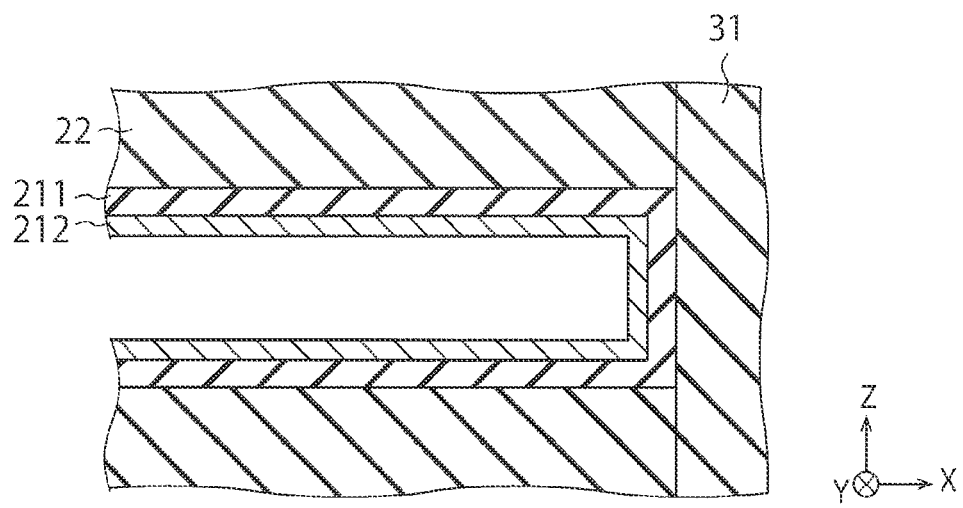
FIG. 4 is a cross sectional view for explaining a step of forming a barrier metal layer.

First, as shown in FIG. 3, the block insulating layer 211 is formed on the surfaces of the insulating layers 22. Next, as shown in FIG. 4, the barrier metal layer 212 is formed on the surface of the block insulating layer 211.

Figure 5:
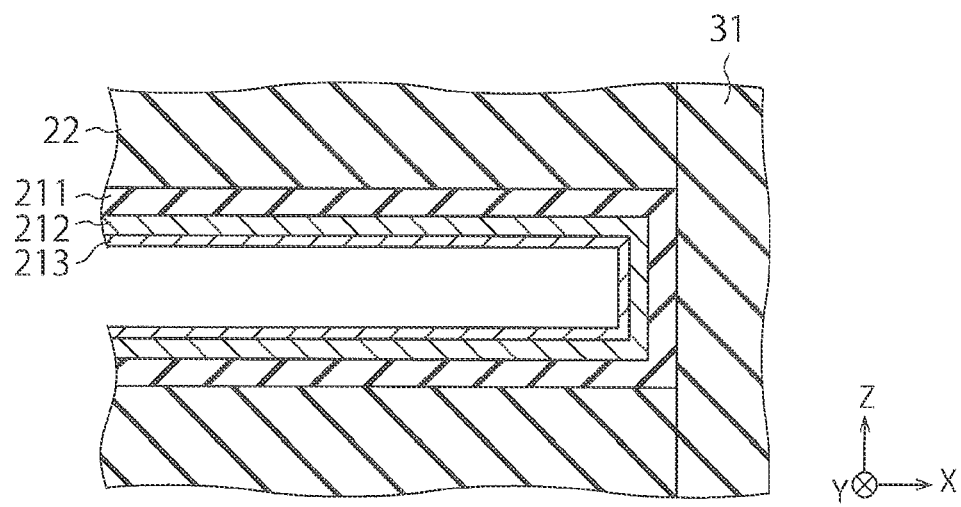
FIG. 5 is a cross sectional view for explaining a step of forming a metal layer.

Next, as shown in FIG. 5, the metal layer 213 is formed on the surface of the barrier metal layer 212. In the present embodiment, the metal layer 213 is formed in a chamber (not shown) in an ALD scheme. A temperature in the chamber is set to be 200 to 350° C. A pressure in the chamber is set to be 400 to 2000 Pa (3 to 15 Torr).

Under the conditions for the temperature and the pressure as set above, first, diborane gas or silane gas is introduced into the chamber. Next, inert gas such as argon gas is introduced into the chamber. Next, material gas such as tungsten hexafluoride gas is introduced into the chamber. After that, the inert gas is introduced again into the chamber. By repeating such introductions of gas, the metal layer 213 is formed, as an initial layer, on the surface of the barrier metal layer 212.

In the final stage, the metal layer 214 is formed, as a bulk layer, on the surface of the metal layer 213. In the present embodiment, the metal layer 214 is formed in a chamber (not shown) for ALD similarly to the metal layer 213.

Figure 6:
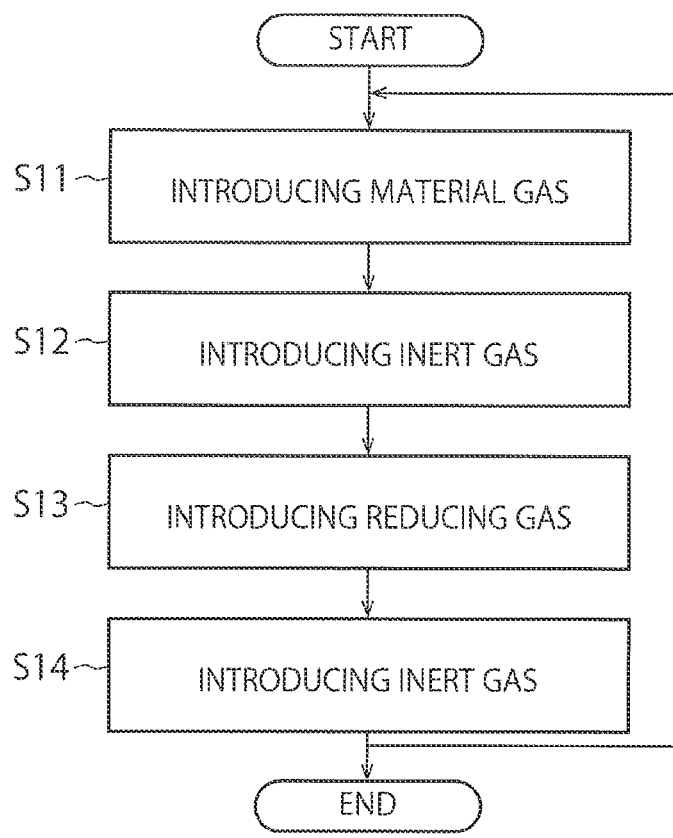
FIG. 6 is a flowchart showing general manufacturing steps of a metal layer by ALD.

FIG. 6 is a flowchart showing general manufacturing steps of a metal layer by ALD. In general, when a metal layer is formed by ALD, first, material gas such as tungsten hexafluoride gas is introduced into a chamber (step S11). Next, inert gas such as argon is introduced into the chamber (step S12). Next, reducing gas such as hydrogen gas is introduced into the chamber (step S13). Next, the inert gas is introduced again into the chamber (step S14).

After such cycles are repeated a predetermined number of times each of which cycles is composed of the aforementioned step S11 to step S14, the metal layer is formed. Meanwhile, when fluorine is contained in the material gas, some of the fluorine occasionally remains in the metal layer. This can cause a concern that the remaining fluorine results in failure such as leakage.

Therefore, in the present embodiment, an additive gas is newly introduced into the chamber in forming the metal layer 214. Since molecules of the additive gas include impurities capable of removing fluorine bonded to tungsten, the impurity results in bonding to tungsten, and a fluorine compound obtained through reaction of fluorine with another element contained in the additive gas is generated.

The impurity, which is contained in the additive gas, is at least one of an aluminum atom (Al), a zirconium atom (Zr), a hafnium atom (Hf), a silicon atom (Si), a boron atom (B), a titanium atom (Ti), an oxygen atom (O), an yttrium atom (Y) and a carbon atom (C) as mentioned above When the impurity is the aluminum atom, the additive gas is desirably gas including TMA (trimethylaluminum) or aluminum chloride ($AlCl_3$), for example. When the impurity is the zirconium atom, the additive gas is desirably gas including zirconium chloride ($ZrCl_4$) or TDMAZ (tetrakis (dimethylamino)zirconium). When the impurity is the hafnium atom, the additive gas is desirably gas including hafnium chloride ($HfCl_4$) or TDMAH (tetrakis(dimethylamino)hafnium).

When the impurity is the silicon atom, the additive gas is desirably gas including monosilane ($SiH_4$), disilane ($Si_2H_6$), trisilane ($Si_3H_8$), monochlorosilane ($SiH_3Cl$), dichlorosilane ($SiH_2Cl_2$), hexachlorosilane ($Si_2Cl_6$), methylsilane ($SiH_3CH_3$) or dimethylsilane ($SiH_2(CH_3)_2$).

When the impurity is the boron atom, the additive gas is desirably gas including diborane or boron trichloride ($BCl_3$). When the impurity is the titanium atom, the additive gas is desirably gas including titanium tetrachloride ($TiCl_4$) or TDMAT (tetrakis(dimethylamino)titanium). When the impurity is the carbon atom or the oxygen atom, the additive gas is desirably gas including carbon monoxide (CO), carbon dioxide ($CO_2$), an oxygen molecule ($O_2$), nitrous oxide ($N_2O$) or nitric monoxide (NO).

When diborane gas among the aforementioned inert gases is used for forming the metal layer 214, the temperature (film formation temperature) in the chamber is desirably set to be approximately 200 to 400° C. because of high reactivity of diborane.

Moreover, if diborane gas were introduced simultaneously to the tungsten hexafluoride gas (material gas), diborane would result in its reaction with tungsten hexafluoride. Therefore, diborane gas is desirably introduced in different timing from that for the tungsten hexafluoride gas. For example, in order to restrain decomposition of diborane, the diborane gas is desirably introduced into the chamber simultaneously to the hydrogen gas (reducing gas) in step S13 mentioned above. This can control an amount of boron taken into the metal layer 214.

When monosilane gas is used for the inert gas, the temperature (film formation temperature) in the chamber can be set to be approximately 200 to 500° C. because of a higher decomposition temperature of monosilane than a decomposition temperature of diborane. Moreover, since monosilane is highly reactive with tungsten hexafluoride similarly to diborane, monosilane is desirably introduced in different timing from that for the tungsten hexafluoride gas. The monosilane gas is also desirably introduced simultaneously to the hydrogen gas in step S13 mentioned above similarly to diborane. This can control an amount of silicon taken into the metal layer 214.

When diborane gas and silane gas are used for the inert gas, if concentrations of boron and silicon taken into the metal layer 214 are high, a resistance of the metal layer 214 increases. Therefore, by adjusting flow rates, partial pressures, periods of introduction, and the like of the diborane gas and the silane gas, a boron concentration or a silicon concentration in the metal layer 214 is desirably set to be $1 \times 10^{19}$ to $1 \times 10^{21}$ atoms/cm$^3$.

According to the present embodiment described above, since the additive gas is introduced for every cycle in forming the metal layer 214, the impurity is taken into the metal layer 214 so as to take a uniform concentration therein. Since in this stage, the impurity promotes cleavage of a bond between the metal (tungsten) of the metal layer 214 and fluorine, fluorine scarcely remains in the metal layer 214. Accordingly, failure originated from fluorine can be improved in a thermal process performed after formation of the electrode layers 21.

Second Embodiment

Figure 7:
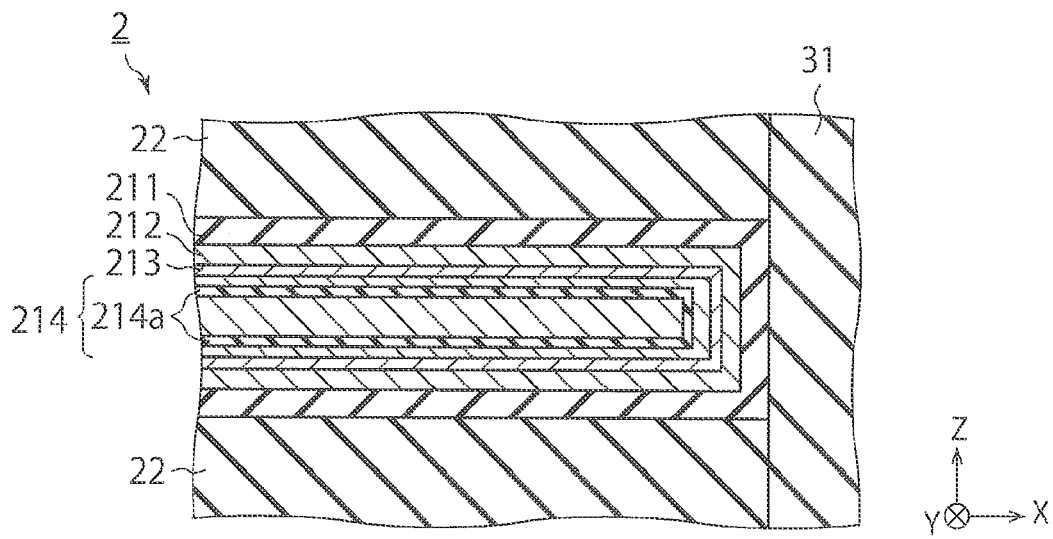
FIG. 7 is a cross sectional view having the essential part of a semiconductor device according to a second embodiment expanded.

FIG. 7 is a cross sectional view having the essential part of a semiconductor device according to a second embodiment expanded. The similar components to those for the aforementioned first embodiment are given the same signs and their detailed description is omitted.

In a semiconductor device 2 according to the present embodiment, a structure of the metal layer 214 is different from that for the first embodiment. As shown in FIG. 7, the metal layer 214 has a high concentration layer 214a in which the concentration of the impurity described for the first embodiment is locally high. Similarly to the first embodiment, the metal layer 214 is formed with an additive gas including the aforementioned impurity. The larger the amount of the impurity taken into the metal layer 214 is, the larger the resistance of the metal layer 214 becomes.

Therefore, in the present embodiment, after the cycle of gas introduction in step S11 to step S14 shown in FIG. 6 is repeated a predetermined number of times, the cycle in which the additive gas is introduced is performed, and thereby, the metal layer 214 is formed. For example, when the impurity is exemplarily diborane, every time when 250 cycles of introduction of the material gas including tungsten hexafluoride, introduction of the inert gas including argon, introduction of the reducing gas including hydrogen, and introduction of the inert gas including argon are performed, a cycle of the introduction of the aforementioned material gas, the introduction of the aforementioned inert gas, simultaneous introduction of diborane gas and the aforementioned reducing gas, and the introduction of the aforementioned inert gas is added. Thereby, there is formed, in the metal layer 214, at least one high concentration layer 214a in which the diborane concentration is locally high.

According to the present embodiment described above, similarly to the first embodiment, fluorine scarcely remains in the metal layer 214 due to the impurity contained in the additive gas. Moreover, introduction of the additive gas is reduced to be as less as possible. Thereby, failure originated from fluorine can be reduced while the resistance of the metal layer 214 is reduced.

Third Embodiment

A third embodiment is hereafter described. Its differences from the first embodiment are herein mainly described. A formation method of the metal layer 214 in the present embodiment is different from that in the first embodiment.

In the present embodiment, the additive gas has a property of scarcely reacting with the material gas or the reducing gas. Therefore, the additive gas is continuously introduced throughout step S11 to step S14 shown in FIG. 6. Thereby, there can be sufficiently secured a time for taking the impurity contained in the additive gas into the metal layer 214, in other words, a time for removing fluorine from the metal layer 214. When the material gas includes tungsten hexafluoride and the reducing gas includes hydrogen, the additive gas includes titanium tetrachloride or dichlorosilane.

According to the present embodiment described above, the additive gas that scarcely reacts with the material gas or the reducing gas is used, and thereby, there can be sufficiently secured a time for removing fluorine from the metal layer 214. This can further reduce failure originated from fluorine.

Fourth Embodiment

A fourth embodiment is hereafter described. In the present embodiment, the additive gas has an effect of reducing the metal contained in the material gas. When the material gas includes tungsten hexafluoride and the reducing gas includes hydrogen, the additive gas exemplarily includes carbon monoxide.

When the metal layer 214 is formed using the additive gas including carbon monoxide, the carbon monoxide gas is introduced simultaneously to the hydrogen gas which is the reducing gas. Since this enhances power of reducing tungsten, a cycle rate of the metal layer 214 can be improved.

Moreover, by adjusting an amount of addition of the carbon monoxide gas, carbon can be taken into the metal layer 214 as desired. Therefore, failure originated from fluorine can be reduced while the resistance of the metal layer 214 is reduced.

Fifth Embodiment

A fifth embodiment is hereafter described. In the present embodiment, the additive gas has a property of oxidizing the metal contained in the metal layer 214. When the material gas includes tungsten hexafluoride, the additive gas is exemplarily oxidation gas.

Figure 8:
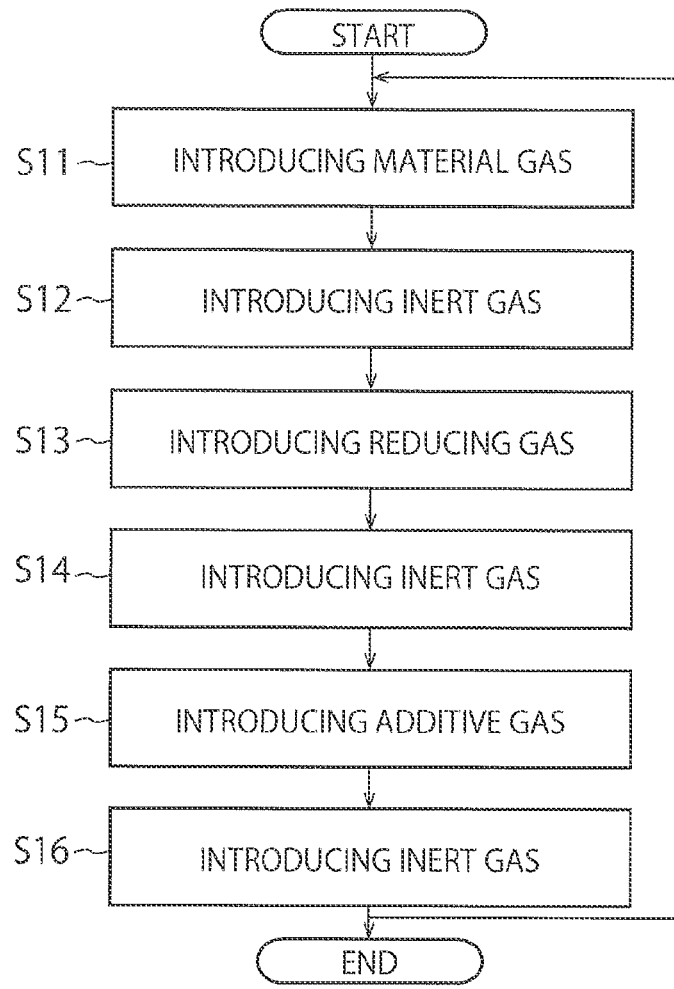
FIG. 8 is a flowchart showing manufacturing steps of the metal layer in a fifth embodiment.

FIG. 8 is a flowchart showing manufacturing steps of the metal layer 214 in the present embodiment. Description of the similar steps to those of the flowchart shown in FIG. 6 is omitted.

As shown in FIG. 8, in the present embodiment, the additive gas is introduced (step S15) after the inert gas introduction step (step S14). After that, the inert gas is introduced again (step S16). When the gas introduction steps as above are repeated, a surface of tungsten formed into a film is oxidized by the additive gas, and hence, the resulting tungsten oxide can be etched when the material gas including tungsten hexafluoride is introduced in the next cycle.

In the present embodiment, by adjusting an amount of introduction of the additive gas (oxidation gas) such that the tungsten oxide can be easily etched (coverage thereof is poor), a frontage of the metal layer 214 (outward opening part thereof) expands in introducing the material gas. This improves a property of embedding tungsten.

Moreover, when the additive gas is oxidation gas, an oxygen concentration in the metal layer 214 is highest at and near the frontage and becomes lower more inward (more on the block insulating film 31 side). Therefore, by adjusting the amount of introduction of the oxidation gas, the property of embedding tungsten can be improved and failure originated from fluorine can be reduced while the resistance of the metal layer 214 is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, comprising:
   forming a barrier metal layer on a surface of an insulating layer;
   forming a first metal layer on a surface of the barrier metal layer by repeatedly introducing a material gas including tungsten hexafluoride ($WF_6$), an inert gas, and a reducing gas into a chamber;
   forming, on a surface of the first metal layer, a second metal layer by repeating the introduction of the material gas, the inert gas, and the reducing gas, and introducing an additive gas including an impurity configured to remove fluorine bonded to the tungsten,
   removing the fluorine bonded to the tungsten during the repeated introduction of the material gas, the inert gas, the reducing gas, and the additive gas, and
   forming, in the second metal layer, a first portion having a first impurity concentration and a second portion having a second impurity concentration and covering a top, bottom, and side surfaces of the first portion;
   wherein the impurity includes a silicon atom (Si), and the additive gas includes dichlorosilane ($SiH_2Cl_2$),
   wherein the first impurity concentration is higher than the second impurity concentration, and
   wherein a silicon concentration of the silicon atom in the second metal layer is set by adjusting flow rates, partial pressures, and periods of introduction of silane gas for the silicon concentration.

2. The manufacturing method of claim 1, further comprising:
   using diborane gas as the inert gas for forming the second metal layer, and setting the film formation temperature to be 200 to 400° C.

3. The manufacturing method of claim 1, wherein
   the diborane gas is introduced simultaneously with the reducing gas.

4. The manufacturing method of claim 1, further comprising:
   using silane gas as the inert gas, and setting the silicon concentration in the second metal layer by adjusting flow rates, partial pressures, and periods of introduction of the silane gas.

* * * * *